(12) United States Patent
Hung et al.

(10) Patent No.: US 12,324,255 B2
(45) Date of Patent: Jun. 3, 2025

(54) PHOTONIC DEVICE AND METHOD HAVING INCREASED QUANTUM EFFECT LENGTH

(71) Applicant: Taiwan Semiconductor Manufacturing Company, Ltd., Hsinchu (TW)

(72) Inventors: Tsai-Hao Hung, Hsinchu (TW); Tao-Cheng Liu, Hsinchu (TW); Ying-Hsun Chen, Taoyuan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 344 days.

(21) Appl. No.: 17/883,707

(22) Filed: Aug. 9, 2022

(65) Prior Publication Data
US 2022/0392945 A1 Dec. 8, 2022

Related U.S. Application Data

(62) Division of application No. 16/867,873, filed on May 6, 2020, now Pat. No. 11,688,754.

(51) Int. Cl.
*H10F 39/18* (2025.01)
*H10F 39/00* (2025.01)
*H10F 39/12* (2025.01)

(52) U.S. Cl.
CPC ............ *H10F 39/18* (2025.01); *H10F 39/024* (2025.01); *H10F 39/199* (2025.01); *H10F 39/805* (2025.01); *H10F 39/8063* (2025.01); *H10F 39/8067* (2025.01); *H10F 39/809* (2025.01); *H10F 39/811* (2025.01)

(58) Field of Classification Search
None
See application file for complete search history.

(56) References Cited

U.S. PATENT DOCUMENTS

| | | | |
|---|---|---|---|
| 2010/0078680 A1* | 4/2010 | Cheng | H01L 21/02532 257/292 |
| 2011/0163364 A1 | 7/2011 | Kim et al. | |
| 2013/0149807 A1 | 6/2013 | JangJian et al. | |
| 2016/0005781 A1 | 1/2016 | Lin et al. | |

(Continued)

FOREIGN PATENT DOCUMENTS

| | | |
|---|---|---|
| TW | 201143040 A | 12/2011 |
| TW | 201240072 A | 10/2012 |
| TW | 202018964 A | 5/2020 |

OTHER PUBLICATIONS

Non-Final Office Action dated Oct. 14, 2022 for U.S. Appl. No. 16/867,873.

(Continued)

*Primary Examiner* — Michelle Mandala
*Assistant Examiner* — Jordan M Klein
(74) *Attorney, Agent, or Firm* — Eschweiler & Potashnik, LLC

(57) ABSTRACT

A method is provided that includes forming a cavity in a substrate. The cavity is formed to extend into the substrate from a first surface to a second surface. Sidewall spacers are formed on sidewalls of the substrate in the cavity. A semiconductor layer is formed on the second surface in the cavity of the substrate, and the semiconductor layer abuts the sidewall spacers in the cavity.

20 Claims, 10 Drawing Sheets

(56) References Cited

U.S. PATENT DOCUMENTS

| | | | |
|---|---|---|---|
| 2016/0225922 A1* | 8/2016 | Akkaya | H01L 31/028 |
| 2017/0025458 A1 | 1/2017 | Lin et al. | |
| 2018/0101082 A1 | 4/2018 | Yu et al. | |
| 2019/0096951 A1 | 3/2019 | Cheng et al. | |
| 2019/0378863 A1 | 12/2019 | Chou et al. | |
| 2020/0035741 A1 | 1/2020 | Liu et al. | |
| 2021/0305291 A1 | 9/2021 | Liao et al. | |

OTHER PUBLICATIONS

Notice of Allowance dated Feb. 17, 2023 for U.S. Appl. No. 16/867,873.

* cited by examiner

PHOTONIC DEVICE AND METHOD HAVING INCREASED QUANTUM EFFECT LENGTH

REFERENCE TO RELATED APPLICATION

This application is a Divisional of U.S. application Ser. No. 16/867,873, filed on May 6, 2020, the contents of which are hereby incorporated by reference in their entirety.

BACKGROUND

Photonic devices, such as image sensors, photodetectors, photosensors, or the like, are sensors of light or other electromagnetic radiation. Such devices generally convert incident light photons into an electrical signal, such as a current. The incident light may be converted to current by a semiconductor material, which absorbs photons thereby causing electrons to transition from the conduction band of the material to free electrons.

Photonic devices generally have a quantum efficiency that is limited by the dimension of the semiconductor material (or quantum effect material) that absorbs the photons to generate the electrical signal. Quantum efficiency (QE) is the fraction of incident photons that contribute to the electric signal

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
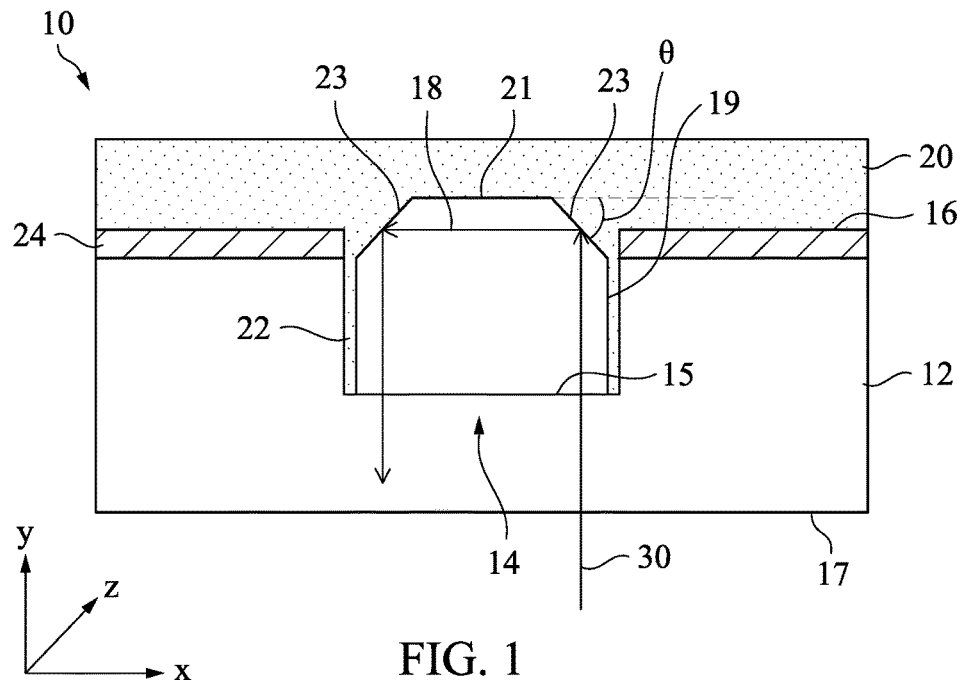
FIG. 1 is a cross-sectional view illustrating a device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to deposition techniques for depositing dielectric layers, metals, or any other materials includes such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described.

Reference throughout the specification to etching techniques for selective removal of semiconductor materials, dielectric materials, metals, or any other materials includes such processes as dry etching, wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain etching techniques should not be limited to those described.

Some image sensors, such as complementary metal-oxide-semiconductor (CMOS) image sensors, include a semiconductor substrate (e.g., of monocrystalline silicon) and an array of photodetectors arranged in the semiconductor substrate. The photodetectors are formed in the semiconductor substrate and circuitry such as transistors is arranged on or in the semiconductor substrate and electrically coupled to the photodetectors. The photodetectors are configured to absorb incident radiation and to generate an electric signal corresponding to the incident radiation.

A challenge with image sensors is that incident radiation has a path length (which may be referred to herein as a "quantum effect length") that is limited by a dimension of the photodetectors. Therefore, the photodetectors generally have a quantum efficiency that is similarly limited by the dimension of the photodetectors. Quantum efficiency (QE) is the fraction of incident photons which contribute to the electric signal.

One potential approach for enhancing the quantum efficiency of CMOS image sensors is to increase the thickness of the semiconductor substrate and increase the depth to which the photodetectors extend into the semiconductor substrate. By increasing the depth of the photodetectors, the quantum effect length of incident radiation traveling through the photodetectors may be increased, thereby increasing the quantum efficiency of the image sensor. However, this is difficult with existing CMOS processes and adds cost to the manufacture of the CMOS image sensors. Further, increasing the depth to which the photodetectors extend into the semiconductor substrate increases cross talk and die size.

In view of the foregoing, various embodiments of the present application are directed towards photonic devices, structures, and methods in which a semiconductor layer that receives incident irradiation and converts the received irradiation into an electrical signal has a high quantum efficiency. The quantum efficiency may be achieved by increasing the quantum effect length of the received irradiation through the semiconductor material, which in some embodiments is facilitated by total internal reflection of the irradiation within the semiconductor material.

FIG. 1 is a cross-sectional view illustrating a device 10 in accordance with one or more embodiments of the present disclosure.

The device 10 may be, in various embodiments, any structure suitable to convert an optical signal into an electrical signal. In some embodiments, the device 10 is a photodetector which may be included in an image sensor, such as a CMOS image sensor.

As shown in FIG. 1, the device 10 includes a substrate 12. A cavity 14 extends into the substrate 12, for example, from a front surface 16 of the substrate 12 toward a back surface 17 of the substrate 12 that is opposite the front surface 16. In alternative embodiments, the cavity 14 may extend into the substrate 12 from the back surface 17 toward the front surface 16. The cavity 14 is shown having a rectangular view in cross-section; however, embodiments of the present disclosure are not limited thereto. In various embodiments, the cavity 14 may have any shape. In various embodiments, the cavity 14 may have a generally rectangular or cubic shape, a circular, rounded, or cylindrical shape, or any other suitable shape.

In some embodiments, the cavity 14 has a width (e.g., along the X-axis direction as shown in FIG. 1) that is less than 750 μm. In some embodiments, the cavity 14 has a length (e.g., along the Z-axis direction) that is less than 750 μm. In some embodiments, the cavity 14 has a height or depth (e.g., along the Y-axis direction) that is less than 700 μm. However, embodiments of the present embodiment are not limited thereto, and in various embodiments, the cavity 14 may have various different dimensions and shapes.

The substrate 12 may be any suitable semiconductor substrate. In various embodiments, the substrate 12 may be formed of a crystalline semiconductor material, for example, monocrystalline silicon, polycrystalline silicon, or some other type of crystalline semiconductor material. In some embodiments, the substrate 12 is a silicon substrate; however, embodiments provided herein are not limited thereto. For example, in various embodiments, the substrate 12 may include gallium arsenide (GaAs), gallium nitride (GaN), silicon carbide (SiC), or any other semiconductor material. The substrate 12 may include various doping configurations depending on design specifications. In some embodiments, the substrate 12 is a p-type substrate having a concentration of p-type dopants. In other embodiments, the substrate 12 is a n-type substrate having a concentration of n-type dopants.

A semiconductor layer 18 is formed in the cavity 14 of the substrate 12. The semiconductor layer 18 may be formed of any semiconductor material suitable to absorb radiation (e.g., from incident light) and to generate an electrical signal based on the absorbed radiation. In some embodiments, the semiconductor layer 18 is formed of a semiconductor material that is different from a semiconductor material of the substrate 12. In some embodiments, the semiconductor layer 18 is an epitaxial semiconductor layer.

In various embodiments, the semiconductor layer 18 may be formed of, for example, germanium (Ge), silicon germanium (SiGe), any Group III-V semiconductor material or Group III-V compound semiconductor materials, or any other semiconductor material suitable to absorb radiation and generate an electrical signal based on the absorbed radiation. In some embodiments, the semiconductor layer 18 be formed of a semiconductor material that has a low energy bandgap, and the low energy bandgap may be, for example, an energy bandgap that is less than about 1 electron volt (eV). In some embodiments, the semiconductor layer 18 may have an energy bandgap that is less than an energy bandgap of the substrate 12.

The electric signal generated by the semiconductor layer 18 may, for example, result from electron-hole pairs generated in response to absorbing photons of the radiation 30.

As shown in FIG. 1, the semiconductor layer 18 includes side surfaces 19, an upper surface 21, and one or more facets or angled surfaces 23 which extend between the side surfaces 19 and the upper surface 21. The side surfaces 19 of the semiconductor layer 18 may be spaced apart from corresponding sidewalls of the substrate 12 within the cavity 14.

In some embodiments, the semiconductor layer 18 has a height (e.g., along the Y-axis direction, as shown in FIG. 1) that is greater than the depth of the cavity 14. For example, as shown in FIG. 1, at least a portion of the semiconductor layer 18 may extend in the Y-axis direction beyond the front surface 16 of the substrate 12. In some embodiments, the height of the semiconductor layer 18 may be less than 750 μm. In some embodiments, the height of the semiconductor layer 18 may be less than 500 μm, less than 300 μm, or less than 200 μm. As will be described in greater detail later herein, the height of the semiconductor layer 18 may be reduced by several orders while providing a good quantum effect length, due to total internal reflection of radiation within the semiconductor layer 18. That is, due to total internal reflection of radiation within the semiconductor layer 18, the height, as well as other dimensions of the semiconductor layer 18, may be significantly reduced as compared to structures in which radiation is not totally internally reflected. The semiconductor layer 18 may have a width (e.g., along the X-axis direction) that is less than the width of the cavity 14.

The device 10 further includes a cover layer 20 on the semiconductor layer 18 and the substrate 12. The cover layer 20 covers the semiconductor layer 18. For example, as shown in FIG. 1, the cover layer 20 covers the upper surface 21, the angled surfaces 23, and the side surfaces 19 of the semiconductor layer 18. In some embodiments, the cover layer 20 directly contacts the upper surface 21, the angled surfaces 23, and the side surfaces 19 of the semiconductor layer 18. In some embodiments, the cover layer 20 completely surrounds the semiconductor layer 18, except for a surface of the semiconductor layer 18 that contacts the substrate 12 (e.g., except for the lower surface of the semiconductor layer 18 as shown in FIG. 1).

The device 10 may further include sidewall spacers 22 that extend between sidewalls of the substrate 12 and facing side surfaces 19 of the semiconductor layer 18. The sidewall spacers 22 may be formed of any dielectric material, and in some embodiments, the sidewall spacers 22 are formed of a same material as the cover layer 20. In some embodiments, the sidewall spacers 22 may be portions of the cover layer 20. That is, portions of the cover layer 20 may extend into the spaces between the sidewalls of the substrate 19 and the side surfaces 19 of the semiconductor layer 18.

In some embodiments, the sidewall spacers 22 have a width (between the sidewalls of the substrate 12 and the facing side surfaces 19 of the semiconductor layer 18) suitable to prevent or impede growth of the semiconductor layer 18 on or from the sidewalls of the substrate 12, for example, during formation of the semiconductor layer 18. In some embodiments, the width of the sidewall spacers 22 is less than 50 µm. In some embodiments, the width of the sidewall spacers 22 is less than 10 µm. In some embodiments, the width of the sidewall spacers 22 is within a range from 50 nm to 10 µm, inclusive.

In some embodiments, the cover layer 20 may be a cover film and may be formed of any electrically insulating or dielectric material. In some embodiments, the cover layer 20 is formed of or includes silicon oxide ($SiO_x$), silicon oxynitride (SiON), silicon nitride (SiN), or the like. Similarly, the sidewall spacers 22 may be formed of any electrically insulating or dielectric material, including one or more of silicon oxide ($SiO_x$), silicon oxynitride (SiON), silicon nitride (SiN), or the like.

The device 10 may further include a dielectric layer 24 between the cover layer 20 and the front surface 16 of the substrate 12. The dielectric layer 24 may be formed of or include any dielectric material. In some embodiments, the dielectric layer 24 is formed of or includes oxide, nitride, silicon oxide ($SiO_x$), silicon oxynitride (SiON), silicon nitride (SiN), or the like. In some embodiments, the dielectric layer 24 extends directly between the front surface 16 of the substrate 12 and the cover layer 20. The dielectric layer 24 may have edges that are aligned with the side surfaces of the cavity 14 in the substrate 12, as shown in FIG. 1.

In some embodiments, the semiconductor layer 18 has a refractive index $\eta_1$ that is greater than a refractive index $\eta_2$ of the cover layer 20. This facilitates total internal reflection of radiation 30 (e.g., light) within the semiconductor layer 18. As shown in FIG. 1, radiation 30 may be received at the back surface 17 of the substrate 12 and may be transmitted through the substrate 12 into the semiconductor layer 18. The radiation 30 is totally internally reflected within the semiconductor layer 18. For example, the radiation 30 may be totally internally reflected at the interface of the angled surfaces 23 of the semiconductor layer 18 and the cover layer 20. In some embodiments, the refractive index $\eta_1$ of the semiconductor layer 18 is within a range from 1 to 10, and the refractive index $\eta_2$ of the cover layer 20 is within a range from 0 to 9, and the refractive index $\eta_2$ of the cover layer 20 is less than the refractive index $\eta_1$ of the semiconductor layer 18. In some embodiments, the refractive index $\eta_1$ of the semiconductor layer 18 is within a range from 2 to 6, and the refractive index $\eta_2$ of the cover layer 20 is within a range from 0 to 2.

Figure 2:
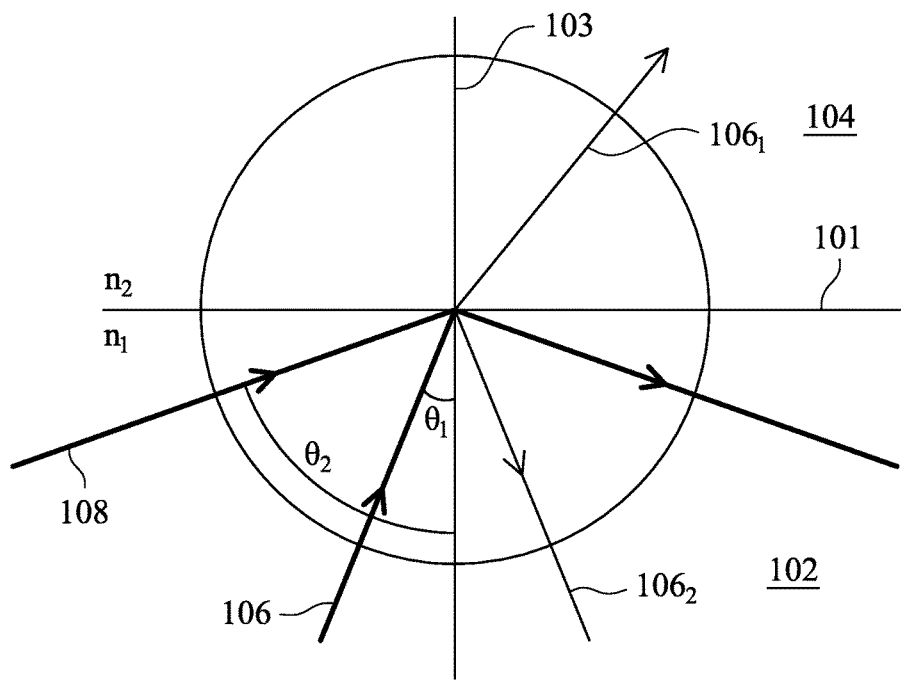
FIG. 2 illustrates total internal reflection of light at an interface between a first material having a first refractive index $\eta_1$ and a second material having a second refractive index $\eta_2$.

Total internal reflection is described in further detail below with reference to FIG. 2. FIG. 2 illustrates total internal reflection of light at an interface 101 between a first material 102 having a first refractive index $\eta_1$ and a second material 104 having a second refractive index $\eta_2$. The first material 102 may represent the semiconductor layer 18 of the device 10, and the second material 104 may represent the cover layer 20.

Total internal reflection occurs when the angle of incidence of the light is greater than the critical angle $\theta_C$. The critical angle $\theta_C$ is the smallest angle of incidence that yields total reflection. For an interface between two materials having different refractive indices (e.g., the interface 101 between the first and second materials 102, 104), the critical angle $\theta_C$ is given by the following equation:

$$\theta_c = \arcsin(n_2/n_1).$$

In embodiments in which the semiconductor layer 18 is germanium and the cover layer 20 is silicon oxide, the semiconductor layer 18 may have a first refractive index $\eta_1$ of about 4 and the cover layer 20 may have a second refractive index $\eta_2$ of about 1.46. Accordingly, the critical angle $\theta_C$ is 21.4°. The critical angle $\theta_C$ and the angles of incidence of light are measured with respect to the normal 103 to the interface 101 between the first and second materials 102, 104.

In the example shown in FIG. 2, a first light 106 having an angle of incidence $\theta_1$ that is less than the critical angle $\theta_C$ is only partially reflected at the interface 101 between the first material 102 and the second material 104. That is, a first portion 1061 of the first light 106 is refracted and transmitted into the second material 104, while a second portion 1062 of the first light 106 is reflected at the interface 101. In contrast, a second light 108 having an angle of incidence $\theta_2$ that is greater than the critical angle $\theta_C$ is totally internally reflected at the interface 101 between the first material 102 and second material 104.

Referring again to FIG. 1, the radiation 30 may be totally internally reflected at the interface of the angled surfaces 23 of the semiconductor layer 18 and the cover layer 20. The presence of the angled surfaces 23 facilitates total internal reflection of the radiation 30. For example, without the angled surfaces 23, light that is transmitted along the direction of the radiation 30 would encounter a surface (e.g., upper surface of the semiconductor layer 18) that is substantially orthogonal to the direction of the light, and the angle of incidence with respect to the normal to such a surface would be substantially 0°, which is less than the critical angle. In such a case, the light would not be totally internally reflected and some, if not most or even all, of the light would be transmitted into the cover layer 20.

On the other hand, as shown in FIG. 1, due at least in part to the presence of the angled surfaces 23 of the semiconductor layer 18, the angle of incidence of the radiation 30 at the interface between the angled surfaces 23 and the cover layer 20 may be greater than the critical angle, and thus the radiation 30 may be totally internally reflected within the semiconductor layer 18. Moreover, as shown in FIG. 1, the radiation may be totally internally reflected at a first angled surface 23 (e.g., shown on the right-hand side) and may again be totally internally reflected at a second angled surface 23 (e.g., shown on the left-hand side), and the radiation 30 may then be transmitted through the semiconductor layer 18 toward and through the front surface 16 of the substrate 12.

The angled surfaces 23 have an inclination angle θ (e.g., with respect to the lower surface 15 of the substrate 12 in the cavity 14, or with respect to a horizontal line as shown), which may be any angle suitable to facilitate total internal reflection of radiation at the interface of the angled surfaces 23 and the cover layer 20. In some embodiments, the inclination angle θ is between 0° and 90°. In some embodiments, the inclination angle θ is between 30° and 60°, and in some embodiments, the inclination angle θ is between 40° and 50°.

Due to the total internal reflection of the radiation 30, a path length (or quantum effect length) of the radiation 30 within the semiconductor material 18 may be extended, which increases quantum efficiency (QE) of the of the semiconductor material 18, as the quantum effect length is increased, thereby increasing an amount or fraction of the photons within the radiation 30 that contribute to the electric signal generated by the semiconductor material 18. Since the distance that light travels through the semiconductor material 18 (e.g., the quantum effect length) is increased due to the total internal reflection of the light, and since the quantum efficiency is similarly increased, the size or dimensions of the semiconductor material 18 may be reduced as compared to a size or dimensions of semiconductor material in which radiation is not internally reflected, while providing a same quantum effect length through the semiconductor material 18.

The semiconductor material 18 may have various different shapes and dimensions, which may be selected to provide a desired quantum effect length. The shape and dimensions for the semiconductor material 18 shown in FIG. 1 are provided merely as an example, and various other shapes and dimensions may be utilized in various embodiments, for example, as will be described later herein with respect to FIGS. 5A to 10B. Additionally, it is noted that in various embodiments, total internal reflection of incident radiation at the interface of the semiconductor material 18 and the cover layer 20 may be achieved, at least in part, in conjunction with one or more lenses or microlenses configured to direct or focus the incident radiation so that the incidence angle of the radiation at one or more interfaces between the semiconductor material 18 and the cover layer 20 will be greater than the critical angle $\theta_C$.

In some embodiments, the device 10 may be configured to receive incident radiation 30 and to totally internally reflect the radiation 30 at least one time within the semiconductor material 18. In some embodiments, the device 10 may be configured to totally internally reflect the radiation 30 at least two times within the semiconductor material 18, for example, as shown in FIG. 1.

FIGS. 3A through 3E are cross-sectional views illustrating a method of forming a photodetector device, such as the device 10 shown in FIG. 1, in some embodiments.

Figure 3A:
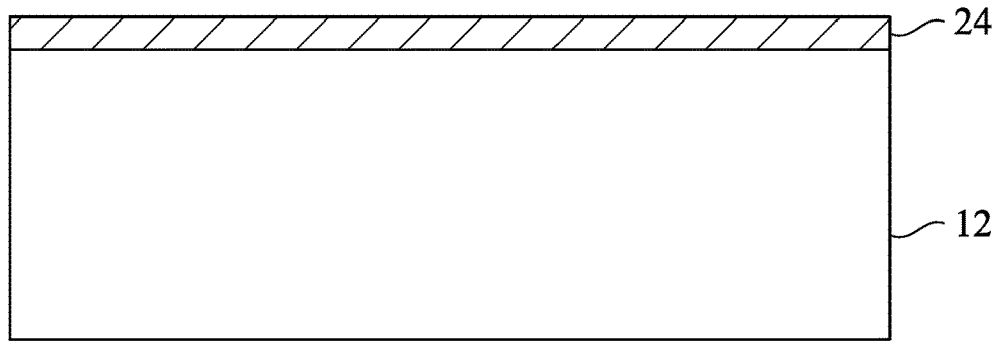
FIGS. 3A through 3E are cross-sectional views illustrating a method of forming a photodetector device, such as the device shown in FIG. 1, in some embodiments.

As shown in FIG. 3A, a dielectric layer 24 is formed on a substrate 12. In some embodiments, the substrate 12 is a silicon substrate; however, embodiments provided herein are not limited thereto. For example, in various embodiments, the substrate 12 may include gallium arsenide (GaAs), gallium nitride (GaN), silicon carbide (SiC), or any other semiconductor material. In some embodiments, the substrate 12 is a p-type substrate having a concentration of p-type dopants, and in other embodiments the substrate 12 is a n-type substrate having a concentration of n-type dopants.

In some embodiments, the dielectric layer 24 is formed of or includes oxide, nitride, silicon oxide ($SiO_x$), silicon oxynitride (SiON), silicon nitride (SiN), or the like. The dielectric layer 24 may be formed by any suitable process, including, for example, deposition, anodization, thermal oxidation, or the like. In some embodiments, the dielectric layer 24 is formed by a deposition process. The deposition process may be any suitable deposition process for depositing a dielectric layer, including, for example, chemical vapor deposition (CVD), low-pressure chemical vapor deposition (LPCVD), plasma-enhanced chemical vapor deposition (PECVD), plasma vapor deposition (PVD), atomic layer deposition (ALD), or the like. In some embodiments, the dielectric layer 24 has a thickness of less than 200 μm. In some embodiments, the dielectric layer 24 has a thickness of less than 100 μm, and in some embodiments, the dielectric layer 24 has a thickness of less than 50 μm.

Figure 3B:
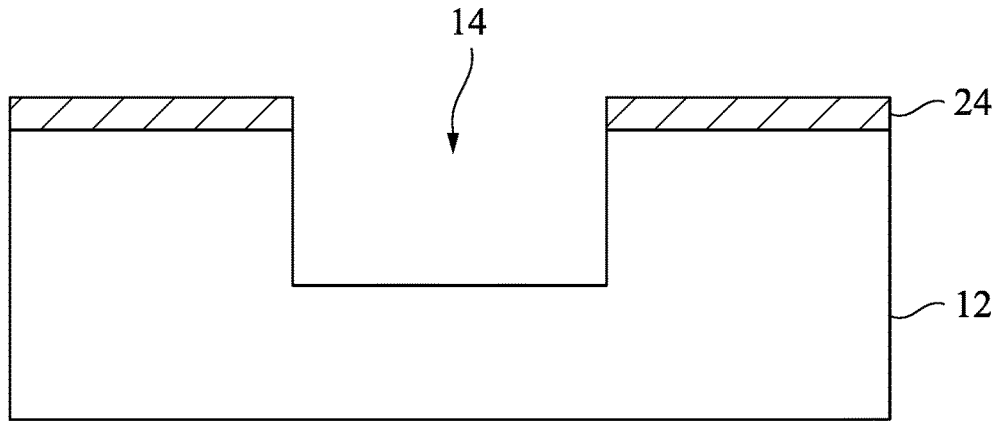

As shown in FIG. 3B, a cavity 14 is formed by removing portions of the dielectric layer 24 and the substrate 12. The portions of the dielectric layer 24 and the substrate 12 may be removed by any suitable process, including, for example, by an etching process. In some embodiments, a mask is formed over regions of the dielectric layer 24 and exposes portions of the dielectric layer 24 that will be removed. An etchant may then be utilized to remove the exposed portions of the dielectric layer 24, as well as portions of the substrate 12 underlying the dielectric layer 24. Any suitable etchant may be utilized, including, for example, any suitable dry etchant or wet etchant such as hydrofluoric acid. The mask may then be removed, leaving the dielectric layer 24 on the front surface 16 of the substrate 12.

The cavity 14 may have any suitable shape. In various embodiments, the cavity 14 may have a generally rectangular or cubic shape, a circular, rounded, or cylindrical shape. In some embodiments, one or more angled surfaces may be formed in the cavity 14, for example, between sidewalls and a lower surface of the cavity. In some embodiments, the cavity 14 has a width that is less than 750 μm. In some embodiments, the cavity 14 has a length that is less than 750 μm. In some embodiments, the cavity 14 has a height or depth that is less than 700 μm. However, embodiments of the present embodiment are not limited thereto, and in various embodiments, the cavity 14 may have various different dimensions and shapes.

Figure 3C:
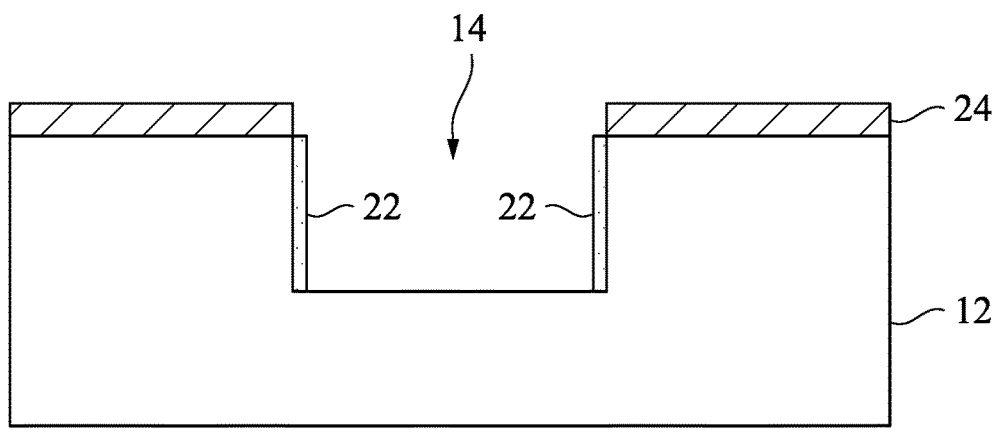

As shown in FIG. 3C, sidewall spacers 22 are formed on sidewalls of the substrate 12 in the cavity 14. The sidewall spacers 22 may be formed by any suitable process, including, for example, deposition, anodization, thermal oxidation, or the like. In some embodiments, the sidewall spacers 22 may be formed by thermal oxidation to produce a thin layer of oxide (e.g., silicon dioxide) on the exposed surfaces of the substrate 12 within the cavity 14. In a thermal oxidation process, an oxidizing agent is forced to diffuse into the substrate 12 at a suitably high temperature and the oxidizing agent reacts with the substrate to form the oxide layer. In some embodiments, portions of the oxide on surfaces of the substrate 12 other than the sidewalls (e.g., portions on a floor of the cavity 14 or on an upper surface of the substrate 12) are removed, leaving only the oxide on the sidewalls of the substrate 12, which form the sidewall spacers 12. The portions of the oxide may be removed by any suitable process, including, for example, by an anisotropic etching process.

In some embodiments, the sidewall spacers 22 have a width suitable to prevent or impede growth of the subsequently formed semiconductor layer 18 on or from the sidewalls of the substrate 12, for example, during formation of the semiconductor layer 18. In some embodiments, the width of the sidewall spacers 22 is less than 50 µm. In some embodiments, the width of the sidewall spacers 22 is less than 10 µm. In some embodiments, the width of the sidewall spacers 22 is within a range from 50 nm to 10 µm, inclusive.

In some embodiments, the sidewall spacers 22 extend from a floor or lower surface 15 of the substrate 12 within the cavity 14 to a level that is substantially coplanar with an upper surface of the substrate 12. However, embodiments of the present disclosure are not limited thereto, and in various embodiments, the sidewall spacers 22 may have upper surfaces that are above or below a level of the upper surface of the substrate 12.

Figure 3D:
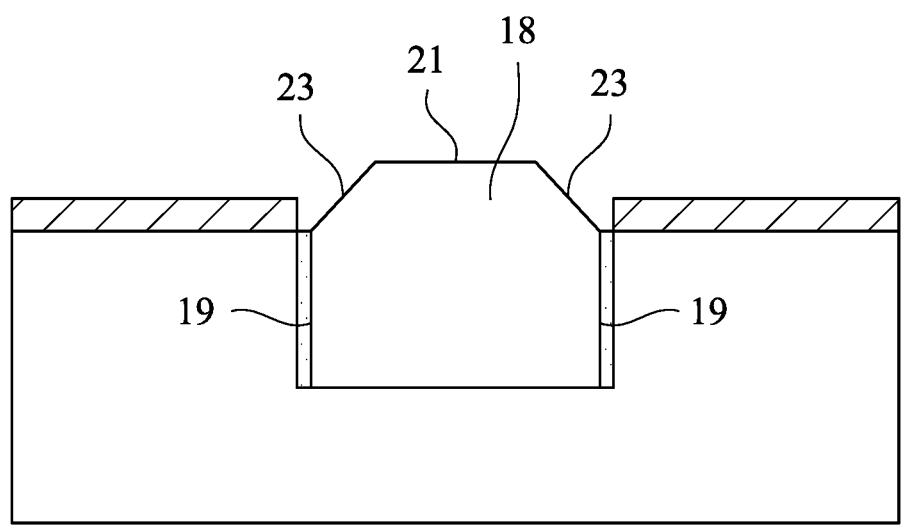

As shown in FIG. 3D, a semiconductor layer 18 is formed in the cavity 14 of the substrate 12. The semiconductor layer 18 may be formed of any semiconductor material suitable to absorb radiation (e.g., from incident light) and to generate an electrical signal based on the absorbed radiation. In some embodiments, the semiconductor layer 18 is formed of a semiconductor material that is different from a semiconductor material of the substrate 12. In some embodiments, the semiconductor layer 18 is an epitaxial semiconductor layer formed of germanium (Ge), silicon germanium (SiGe), any Group III-V semiconductor material or Group III-V compound semiconductor materials, or any other semiconductor material suitable to absorb radiation and generate an electrical signal based on the absorbed radiation.

The semiconductor layer 18 may be epitaxially grown from the exposed surface of the substrate 12 in the cavity 14 (e.g., the lower surface or floor of the cavity 14). The sidewall spacers 22 prevent or impede growth of the semiconductor layer 18 from the sidewalls of the substrate 12, so the semiconductor layer 18 grows upward from the floor of the substrate 12 in the cavity 14 and is spaced apart from the sidewalls of the substrate 12 by the sidewall spacers 22. The growth of the semiconductor layer 18 may be constrained laterally by the sidewall spacers 22. At the upper surface of the sidewall spacers 22, the semiconductor layer 18 forms one or more facets or angled surfaces 23 which extend between the side surfaces 19 and the upper surface 21 of the semiconductor layer 18. The semiconductor layer 18 may be formed of a crystalline structure that naturally grows in faceted shapes, thereby forming the angled surfaces 23 once the semiconductor layer 18 is grown outwardly beyond the upper surface of the sidewall spacers 22.

The shapes (e.g., the angled surfaces 23) of the semiconductor layer 18 are a consequence of the crystal structure of the material of the semiconductor layer 18 and the surface energy, as well as the general conditions under which the crystal formed. The shapes of the semiconductor layer 18 may be variously formed depending on various factors, such as selected or desired growth conditions (e.g., temperature, humidity, pressure, etc.), the crystal orientation of the surface the semiconductor layer 18 is grown on (e.g., of the exposed surface of the substrate 12 in the cavity 14), stress from the substrate 12, the relative energies of the different planes, and the like.

In some embodiments, the semiconductor layer 18 is formed to have a height that is greater than the depth of the cavity 14, and a portion of the semiconductor layer 18 may extend outwardly (e.g., in the Y-axis direction) beyond the front surface 16 of the substrate 12. In some embodiments, the height of the semiconductor layer 18 may be less than 750 µm. In some embodiments, the height of the semiconductor layer 18 may be less than 500 µm, less than 300 µm, or less than 200 µm.

Figure 3E:
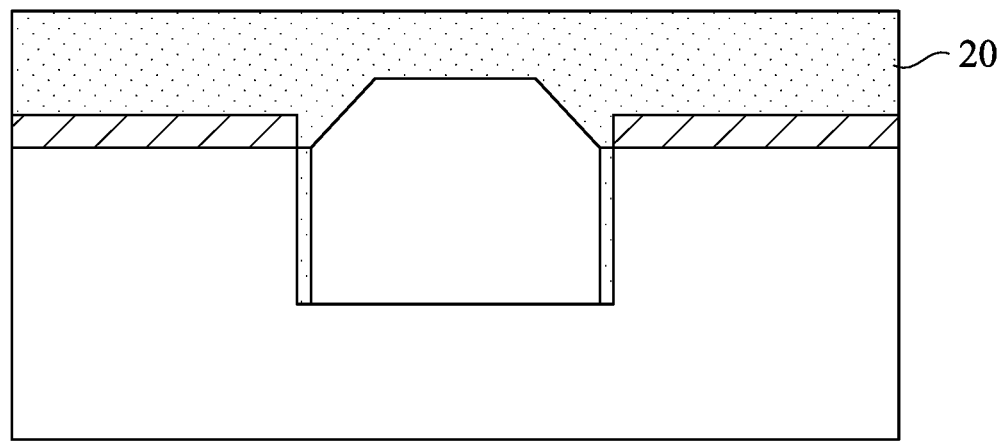

As shown in FIG. 3E, a cover layer 20 is formed on the semiconductor layer 18. The cover layer 20 may be formed by any suitable process, including, for example, deposition, anodization, thermal oxidation, or the like. In some embodiments, the cover layer 20 is formed by a deposition process. The deposition process may be any suitable deposition process for depositing a dielectric layer, including, for example, chemical vapor deposition (CVD), low-pressure chemical vapor deposition (LPCVD), plasma-enhanced chemical vapor deposition (PECVD), plasma vapor deposition (PVD), atomic layer deposition (ALD), or the like.

The cover layer 20 may be formed to cover the semiconductor layer 18, for example, the cover layer 20 may be formed to cover the upper surface 21, the angled surfaces 23, and the side surfaces 19 of the semiconductor layer 18. In some embodiments, the cover layer 20 directly contacts the upper surface 21, the angled surfaces 23, and the side surfaces 19 of the semiconductor layer 18. In some embodiments, the cover layer 20 completely surrounds the semiconductor layer 18, except for a surface of the semiconductor layer 18 that contacts the substrate 12 (e.g., except for the lower surface of the semiconductor layer 18).

In some embodiments, the cover layer 20 may be a cover film and may be formed of any electrically insulating or dielectric material. In some embodiments, the cover layer 20 is formed of or includes silicon oxide ($SiO_x$), silicon oxynitride (SiON), silicon nitride (SiN), or the like. In some embodiments, the cover layer 20 may be formed of a same material as the sidewall spacers 22.

Although FIGS. 3A through 3E illustrate a method of forming a photodetector device, such as the device 10 shown in FIG. 1, it will be readily appreciated that in various embodiments, the method illustrated in FIGS. 3A to 3E may be implemented to form a plurality of photodetector devices, such as an array of photodetectors or pixels. For example, a plurality of photodetectors may be manufactured adjacent to one another, e.g., in an array, by the illustrated method.

Figure 4:
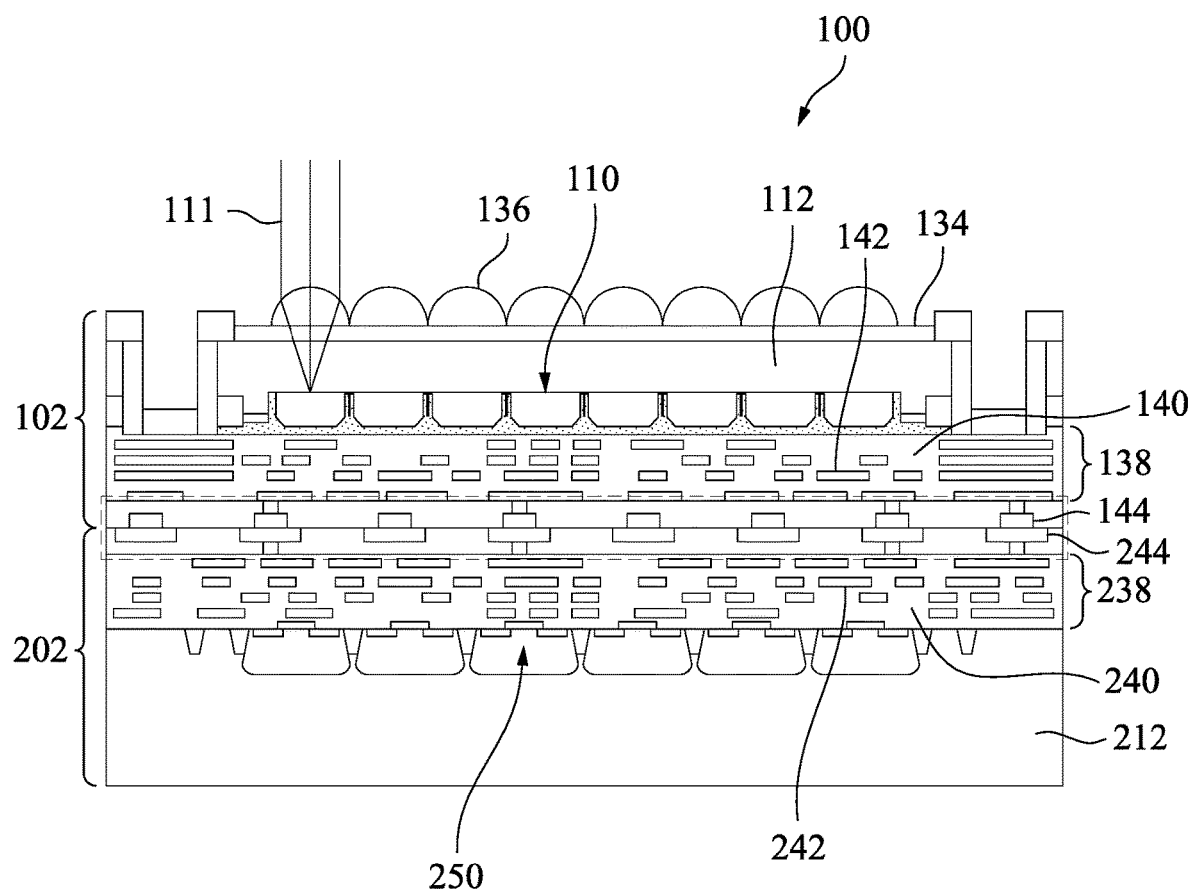
FIG. 4 is a cross-sectional view illustrating an imaging device in accordance with some embodiments.

FIG. 4 is a cross-sectional view illustrating an imaging device 100 in accordance with one or more embodiments of the present disclosure. The imaging device 100 may be any device that converts received irradiation into an electrical signal, and in some embodiments, the imaging device 100 may be an image sensor such as a CMOS image sensor.

The imaging device 100 includes a photonic wafer 102 and a CMOS wafer 202. The photonic wafer 102 includes a plurality of photodetectors 110 formed in a substrate 112. The substrate 112 may be substantially the same or identical to the substrate 12, and the photodetectors 110 may be substantially the same or identical to the device 10 shown and described with respect to FIGS. 1 through 3E. For example, each of the photodetectors 110 may include a respective semiconductor layer formed in a cavity in the substrate 112, and the semiconductor layer may include one or more facets or angled surfaces which may operably increase a quantum path length of received light 111. Further, while not explicitly shown in FIG. 4, the photodetectors 110 may include a cover layer, such as the cover layer 20, which covers the semiconductor layer, and the semiconductor layer may have a refractive index that is greater than a refractive index of the cover layer.

The photodetectors 110 of the photonic wafer 102 may be formed as a pixel array of photodetectors. For example, the photodetectors 110 may be arranged as an array having rows and columns of the photodetectors 110. The imaging device 100 may be a backside illumination device, with irradiation being received at a backside of the photonic wafer 102, as shown.

In some embodiments, a dielectric layer 134 is formed on a backside of the substrate 112 of the photonic wafer 102. Optical lenses 136 may be formed on the dielectric layer 134, and the optical lenses 136 are configured to focus the received light 111 to a respective photodetector 110. In some embodiments, the optical lenses 136 are microlenses, with each of the microlenses having a width that is similar to (and in some embodiments, slightly greater than) the width of the photodetectors 110.

An interconnect structure 138 is formed on a back side of the photodetectors 110 and forms a backside of the photonic wafer 102. The interconnect structure 138 includes an interlayer dielectric (ILD) layer 140, and a plurality of metal layers 142, which may form various wiring layers, vias, or any conductive pathways for transmitting electrical charges received from the photodetectors 110. The ILD layer 140 may be, for example, silicon dioxide, silicon nitride, a low κ dielectric (e.g., fluorosilicate glass (FSG)), some other dielectric, or a combination of the foregoing. A low κ dielectric is a dielectric with a dielectric constant κ less than about 3.9, 3.0, 2.0, or 1.0.

The metal layers 142 are variously arranged within the ILD layer 140, for example, with metal lines and vias electrically coupling the metal lines together. The metal layers 142 may be formed of a conductive material, such as, for example, aluminum copper, copper, aluminum, tungsten, some other conductive material, or a combination of the foregoing. The metal layers 142 electrically couple the photodetectors 110 to bonding pads 144 at a front side of the photonic wafer 102. Accordingly, the metal layers 142 may transmit electrical signals received from the photodetectors 110 to the bonding pads 144. The bonding pads 144 may be formed of any conductive material, and in some embodiments, the bonding pads 144 are formed of aluminum copper, aluminum germanium, copper tin, some other conductive material, or a combination of the foregoing.

The CMOS wafer 202 includes a substrate 212 and electrical circuitry 250 formed in or on the substrate 212. The substrate 212 may be any suitable semiconductor substrate. In various embodiments, the substrate 212 may be formed of a crystalline semiconductor material, for example, monocrystalline silicon, polycrystalline silicon, or some other type of crystalline semiconductor material. In some embodiments, the substrate 212 is a silicon substrate; however, embodiments provided herein are not limited thereto. For example, in various embodiments, the substrate 212 may include gallium arsenide (GaAs), gallium nitride (GaN), silicon carbide (SiC), or any other semiconductor material. In some embodiments, the substrate 212 may be substantially the same as the substrate 112 of the photonic wafer 102.

The electrical circuitry 250 is configured to receive and process the electrical signals generated by the photodetectors 110 in response to receiving the light 111. The electrical circuitry 240 may include, for example, logic or memory devices configured to read or store data generated by the photodetectors 110 in response to incident light 111. In some embodiments, the electrical circuitry 240 may include pixel transistors corresponding to the photodetectors 110 to facilitate readout of the photodetectors 110.

The CMOS wafer 202 includes an interconnect structure 238 on the substrate 212. The interconnect structure 238 may be substantially similar to the interconnect structure 138 of the photonic wafer 102. For example, the interconnect structure may include an ILD layer 240, and a plurality of metal layers 242, which may form various wiring layers, vias, or any conductive pathways for transmitting the electrical charges received from the photodetectors 110 to the electrical circuitry 250. The ILD layer 240 may be, for example, silicon dioxide, silicon nitride, a low κ dielectric (e.g., fluorosilicate glass (FSG)), some other dielectric, or a combination of the foregoing.

The metal layers 242 are variously arranged within the ILD layer 240, for example, with metal lines and vias electrically coupling the metal lines together. The metal layers 242 may be formed of a conductive material, such as, for example, aluminum copper, copper, aluminum, tungsten, some other conductive material, or a combination of the foregoing. The metal layers 242 electrically couple bonding pads 244 at a back side of the CMOS wafer 202 to the electrical circuitry 250.

The photonic wafer 102 is physically bonded to the CMOS wafer 202 by any suitable bonding technique, including by the use of one or more bonding materials, adhesives, or the like. Once bonded together, the bonding pads 144 of the photonic wafer 102 are aligned with and electrically coupled to corresponding bonding pads 244 of the CMOS wafer 202. Accordingly, the metal layers 242 of the CMOS wafer 202 operably transmit electrical signals from the bonding pads 244 (which are received by the bonding pads 244 from the photodetectors 110) to the electrical circuitry 250. The bonding pads 244 may be formed of any conductive material, and in some embodiments, the bonding pads 244 are formed of aluminum copper, aluminum germanium, copper tin, some other conductive material, or a combination of the foregoing.

Figure 5A:
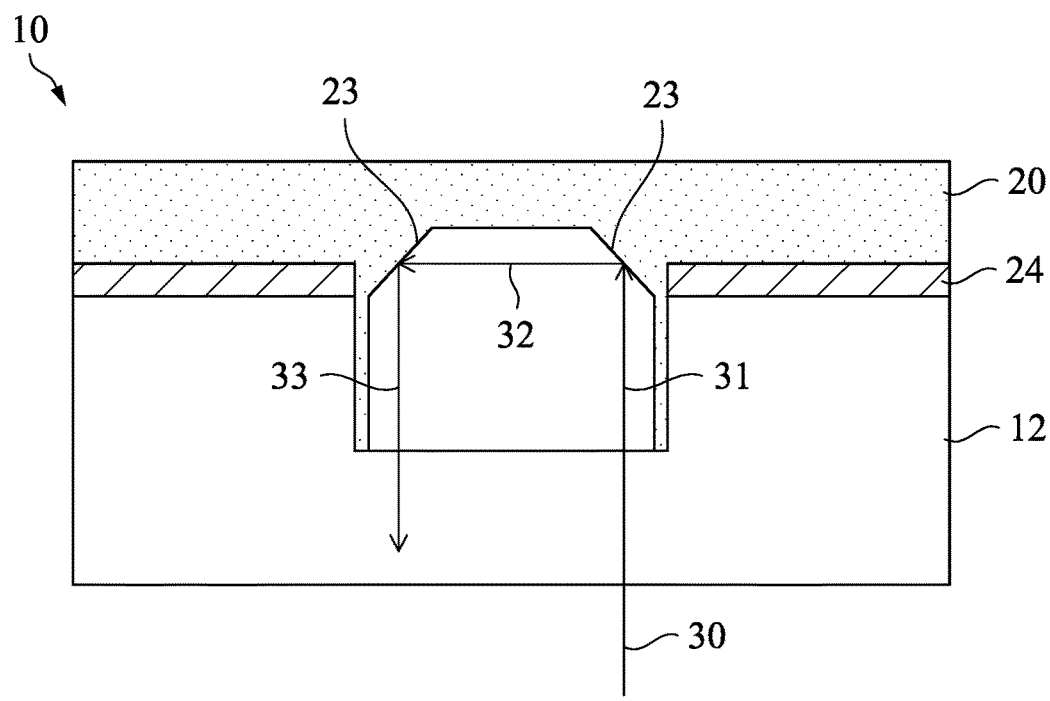
FIG. 5A is cross-sectional view illustrating a device.
Figure 5B:
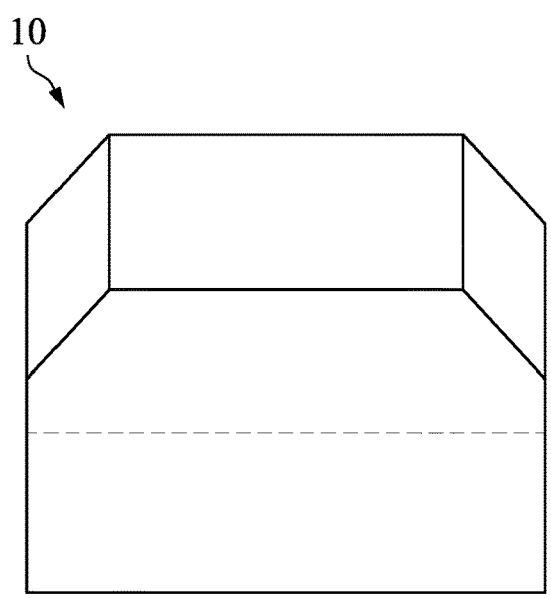
FIG. 5B is a perspective view illustrating the semiconductor layer of the device of FIG. 5A, in accordance with some embodiments.

FIG. 5A is cross-sectional view illustrating the device 10 and FIG. 5B is a perspective view illustrating the semiconductor layer of the device 10, in accordance with one or more embodiments of the present disclosure. The device 10 shown in FIGS. 5A and 5B is the same device 10 shown and described previously herein with respect to FIG. 1. The features of the device 10 previously described will not be described herein with respect to FIGS. 5A and 5B in the interest of brevity.

As shown in FIG. 5A, an optical a path length (or quantum effect length) of the incident radiation 30 within the semiconductor layer 18 includes a first segment 31, a second segment 32, and a third segment 33. The incident radiation 30 travels along the first segment 31 of the quantum effect length until it encounters a first angled surface 23 (e.g., as shown on the right-hand side in FIG. 5A), where the radiation 30 is totally internally reflected at the interface between the first angled surface 23 and the cover layer 20. The totally internally reflected radiation then travels along the second segment 32 of the quantum effect length until it encounters a second angled surface 23 (e.g., as shown on the left-hand side in FIG. 5A), where it may again be totally internally reflected, at which point the radiation 30 travels along the third segment 33 of the quantum effect length and may exit through the substrate 12. The total internal reflection of the radiation 30 within the semiconductor layer 18 thus extends the quantum effect length as compared to structures in which radiation is not totally internally reflected. As shown in FIG. 5A, the incident radiation 30 may be totally internally reflected at two interfaces within the semiconductor layer 18, e.g., at interfaces between each of the angled surfaces 23 and the cover layer 20.

Figure 6A:
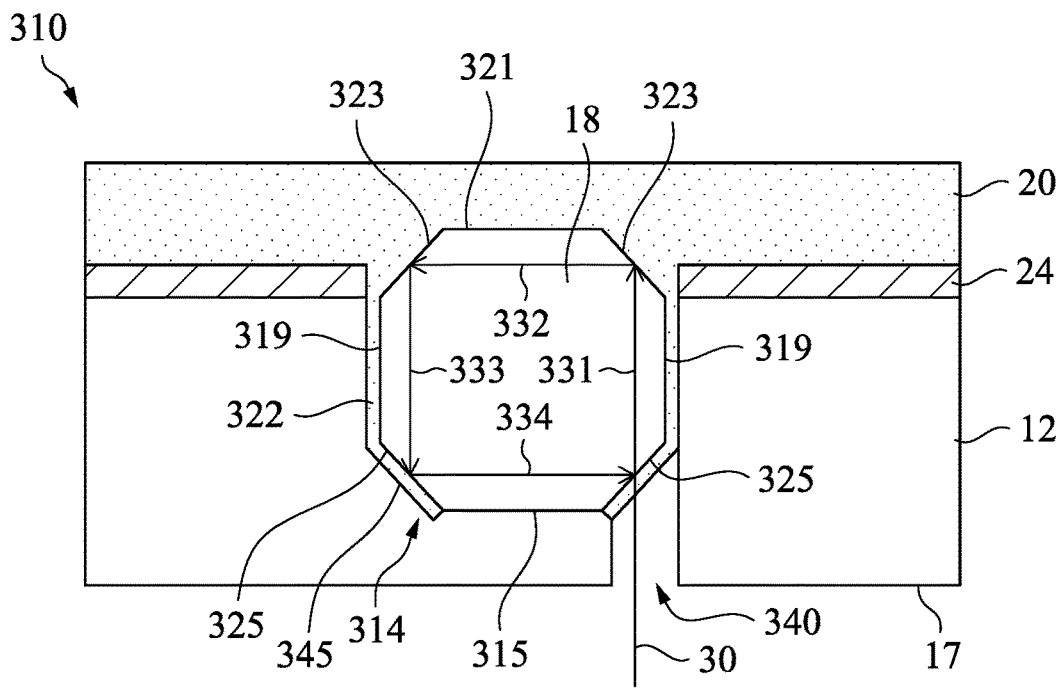
FIG. 6A is cross-sectional view illustrating a device.
Figure 6B:
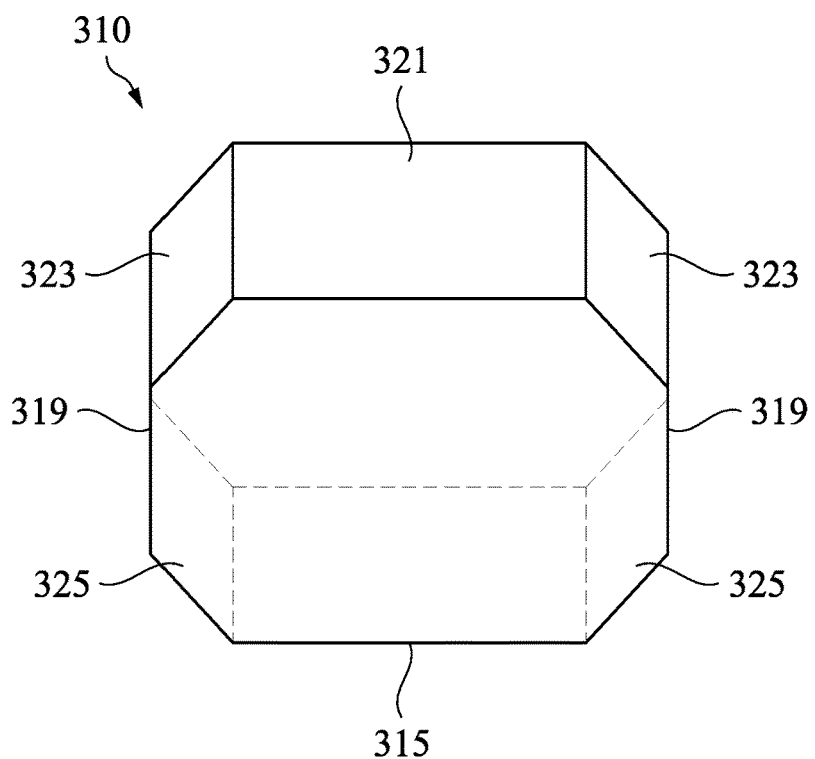
FIG. 6B is a perspective view illustrating the semiconductor layer of the device of FIG. 6A, in accordance with some embodiments.

FIG. 6A is cross-sectional view illustrating a device 310 and FIG. 6B is a perspective view illustrating the semiconductor layer of the device 310, in accordance with one or more embodiments of the present disclosure. The device 310 shown in FIGS. 6A and 6B is substantially similar in many respects to the device 10 shown and described previously herein with respect to FIG. 1. The description of the device 310 will focus on the differences from the device 10 previously described herein. As shown in FIGS. 6A and 6B, the semiconductor layer 18 of the device 310 includes angled surfaces 325 at a lower side of the semiconductor layer 18, in addition to the angled surfaces 323 at the upper side of the semiconductor layer 18 that extend between the side surfaces 319 and the upper surface 321.

The angled surfaces 323 and upper surface 321 are substantially the same or identical to the angled surfaces 23 and upper surface 21, respectively, of the device 10 shown and described previously herein.

The angled surfaces 325 of the device 310 extend between the lower surface 315 and the side surfaces 319 of the semiconductor layer 18. The angled surfaces 323 may be substantially symmetrical (e.g., along the horizontal axis) to the angled surfaces 325. In some embodiments, the angled surfaces 325 have an inclination angle θ, which may be any angle suitable to facilitate total internal reflection of radiation at the interface of the angled surfaces 323 and the cover layer 20. In some embodiments, the inclination angle θ of the angled surfaces 325 is substantially the same as the inclination angle of the angled surfaces 323. In some embodiments, the inclination angle θ is between 0° and 90°. In some embodiments, the inclination angle θ is between 30° and 60°, and in some embodiments, the inclination angle θ is between 40° and 50°.

In some embodiments, the cavity 314 in the substrate 12 in which the semiconductor layer 18 is formed may have a shape that substantially corresponds to a shape of a lower portion of the semiconductor layer 18. For example, the substrate 12 may have may have angled surfaces 345 in the cavity 314 that substantially correspond to the angled surfaces 325 of the semiconductor layer 18.

The device 310 may further include sidewall spacers 322 that extend between sidewalls of the substrate 12 and the semiconductor layer 18 within the cavity 314, and the sidewall spacers 322 may be substantially the same as the sidewall spacers 22 previously described herein with respect to the device 10, and may be formed of any dielectric material. The sidewall spacers 322 extend from the sidewalls and the angled surfaces 345 of the substrate 12 in the cavity 340 to corresponding facing surfaces of the semiconductor layer 18.

In some embodiments, the device 310 may include an opening 340 that extends from the back surface 17 of the substrate 12 into the cavity 314 in which the semiconductor layer 18 is formed. The opening 340 allows incident radiation 30 to pass directly through the opening 340 so that at least some of the radiation 30 does not pass through the substrate 12. The opening 340 may be optional, and in some embodiments, the opening 340 may be omitted.

As shown in FIG. 6A, an optical a path length (or quantum effect length) of the incident radiation 30 within the semiconductor layer 18 includes a first segment 331, a second segment 332, a third segment 333, and a fourth segment 334. The incident radiation 30 may be received at a first lower angled surface 325 of the semiconductor layer 18 (e.g., as shown on the right-hand side in FIG. 6A) and travels along the first segment 331 of the quantum effect length until it encounters a first upper angled surface 323 (e.g., as shown on the right-hand side in FIG. 6A), where the radiation 30 is totally internally reflected at the interface between the first upper angled surface 323 and the cover layer 20. The totally internally reflected radiation then travels along the second segment 332 of the quantum effect length until it encounters a second upper angled surface 323 (e.g., as shown on the left-hand side in FIG. 6A), where it may again be totally internally reflected. The radiation 30 then travels along the third segment 333 of the quantum effect length until it encounters a second lower angled surface 325 of the semiconductor layer 18 (e.g., as shown on the left-hand side in FIG. 6A), where the radiation 30 is totally internally reflected at the interface between the second lower angled surface 325 and the cover layer 20 or sidewall spacer 322 within the cavity 314. The radiation 30 then travels along the fourth segment 334 of the quantum effect length until it again encounters the interface between the first lower angled surface 325 of the semiconductor layer 18 and the cover layer 20 or sidewall spacer 322.

It will be readily appreciated that the device 310 shown in FIGS. 6A and 6B may be formed by the method illustrated in FIGS. 3A through 3E with one or more modifications. For example, the cavity 314 may be formed by a substantially same process as described and illustrated with respect to FIG. 3B; however, the cavity 314 may be formed to have the angled surfaces 345. Moreover, in some embodiments, portions of the substrate 12 may be removed (e.g., by etching, or any suitable technique) to form the opening 340. The sidewall spacers 322 may be formed by thermal oxidation, as described with respect to FIG. 3C; however, the sidewall spacers 322 of the device 310 may be formed on the sidewalls as well as the angled surfaces 345 in the cavity 314. The semiconductor layer 18 may be epitaxially grown from the exposed lower surface 315 of the substrate 12, as described with respect to FIG. 3D.

Figure 7A:
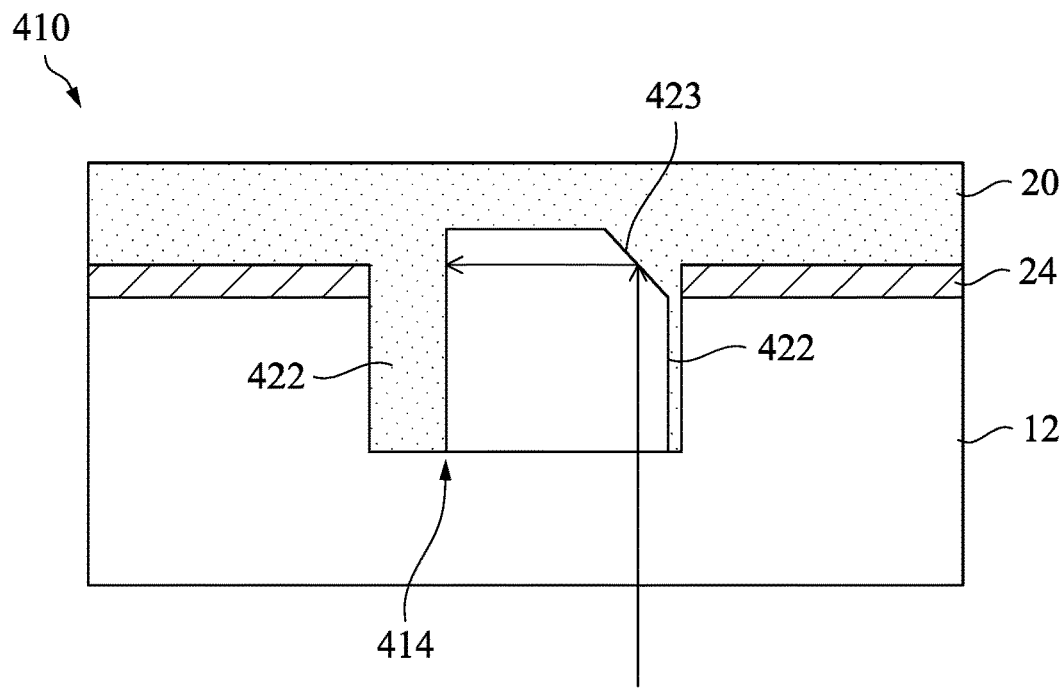
FIG. 7A is cross-sectional view illustrating a device.
Figure 7B:
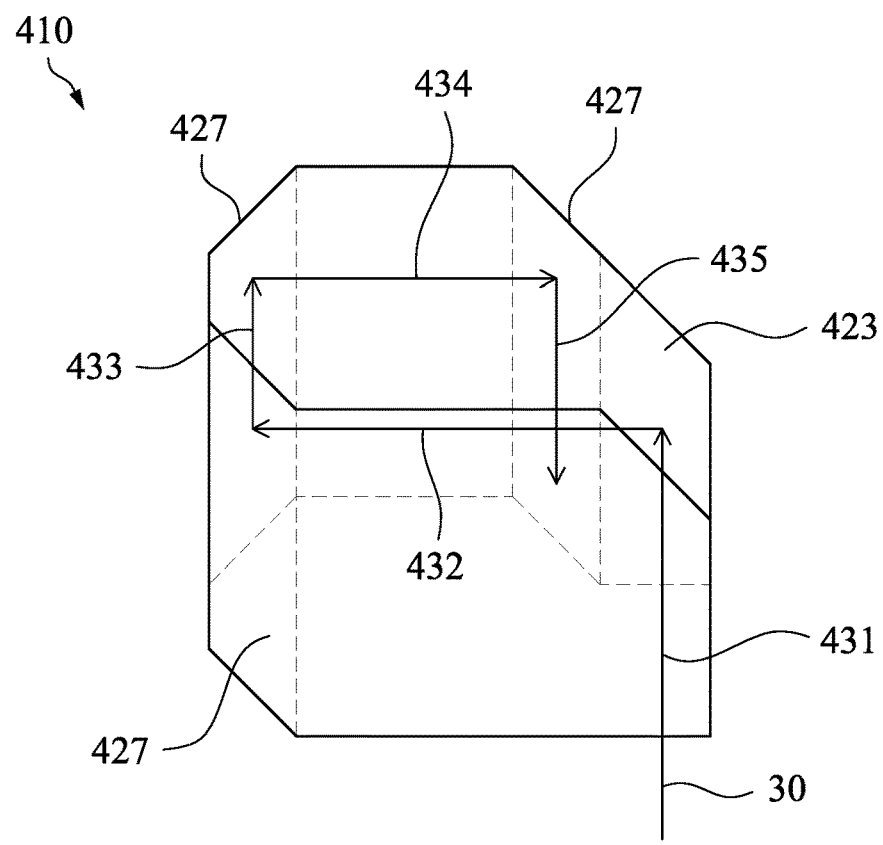
FIG. 7B is a perspective view illustrating the semiconductor layer of the device of FIG. 7A, in accordance with some embodiments.

FIG. 7A is cross-sectional view illustrating a device 410 and FIG. 7B is a perspective view illustrating the semiconductor layer of the device 410, in accordance with one or more embodiments of the present disclosure. The device 410 shown in FIGS. 7A and 7B is substantially similar in many respects to the device 10 shown and described previously herein with respect to FIG. 1. The description of the device 410 will focus on the differences from the device 10 previously described herein. As shown in FIGS. 7A and 7B, the semiconductor layer 18 of the device 410 includes angled side surfaces 427 that extend from a lower side to an upper side of the semiconductor layer 18 along a side portion of the semiconductor layer 18 (e.g., the left-hand side portion as shown in FIG. 7B). The semiconductor layer 18 of the device 410 further includes an angled surface 423 at the upper side of the semiconductor layer 18 along an opposite side portion (e.g., the right-hand side portion as shown in FIG. 7B) as the angled side surfaces 427.

The angled surface 423 of the semiconductor layer 18 may be substantially the same or identical to the angled surfaces 23 of the device 10 of FIG. 1 and/or of the angled surfaces 323 of the device 310 of FIGS. 6A and 6B shown and described previously herein.

The angled side surfaces 427 of the device 410 may be substantially symmetrical to one another and may be formed to have any angle suitable to facilitate total internal reflection of radiation at the interface of the angled side surfaces 427 and the cover layer 20, portions of the cover layer 20 in the cavity 414, or sidewall spacers 422 in the cavity 414.

As shown in FIG. 7B, an optical a path length (or quantum effect length) of the incident radiation 30 within the semiconductor layer 18 includes a first segment 431, a second segment 432, a third segment 433, a fourth segment 434, and a fifth segment 435. The incident radiation 30 may be received at a lower surface of the semiconductor layer 18 and travels along the first segment 431 of the quantum effect length until it encounters the angled surface 423 at the upper side of the semiconductor layer 18, where the radiation 30 is totally internally reflected at the interface between the angled surface 423 and the cover layer 20. The totally internally reflected radiation then travels along the second segment 432 of the quantum effect length until it encounters a first angled side surface 427 (e.g., as shown at the front of the left-hand side in FIG. 7B), where it may be totally internally reflected at the interface of the first angled side surface 427 and the cover layer 20 or sidewall spacer 422. The radiation 30 travels then along the third segment 433 of the quantum effect length until it encounters a second angled side surface 427 (e.g., as shown at the back of the left-hand side in FIG. 7B), where it may be totally internally reflected at the interface of the second angled side surface 427 and the cover layer 20 or sidewall spacer 422. The radiation 30 may then travel along the fourth segment 434 of the quantum effect length until it encounters a third angled side surface 427 (e.g., as shown at the back of the right-hand side in FIG. 7B), where it may be totally internally reflected toward a front side of the semiconductor layer 18.

It will be readily appreciated that the device 410 shown in FIGS. 7A and 7B may be formed by the method illustrated in FIGS. 3A through 3E with one or more modifications. For example, the cavity 414 may be formed by a substantially same process as described and illustrated with respect to FIG. 3B, and may have a rectangular shape, or may be formed to have a shape that corresponds with the side surfaces of the semiconductor layer 18, for example, with angled side surfaces in the cavity 414 that correspond with the angled side surfaces 427 of the semiconductor layer 18. The sidewall spacers 422 may be formed by thermal oxidation, as described with respect to FIG. 3C. The semiconductor layer 18 may be epitaxially grown from the exposed lower surface of the substrate 12, as described with respect to FIG. 3D. In some embodiments, the semiconductor layer 18 may be epitaxially grown in the cavity 414, and post-growth processing (e.g., photolithography, etching, film deposition, etc.) may be performed to achieve a desired shape of the semiconductor layer 18.

Figure 8A:
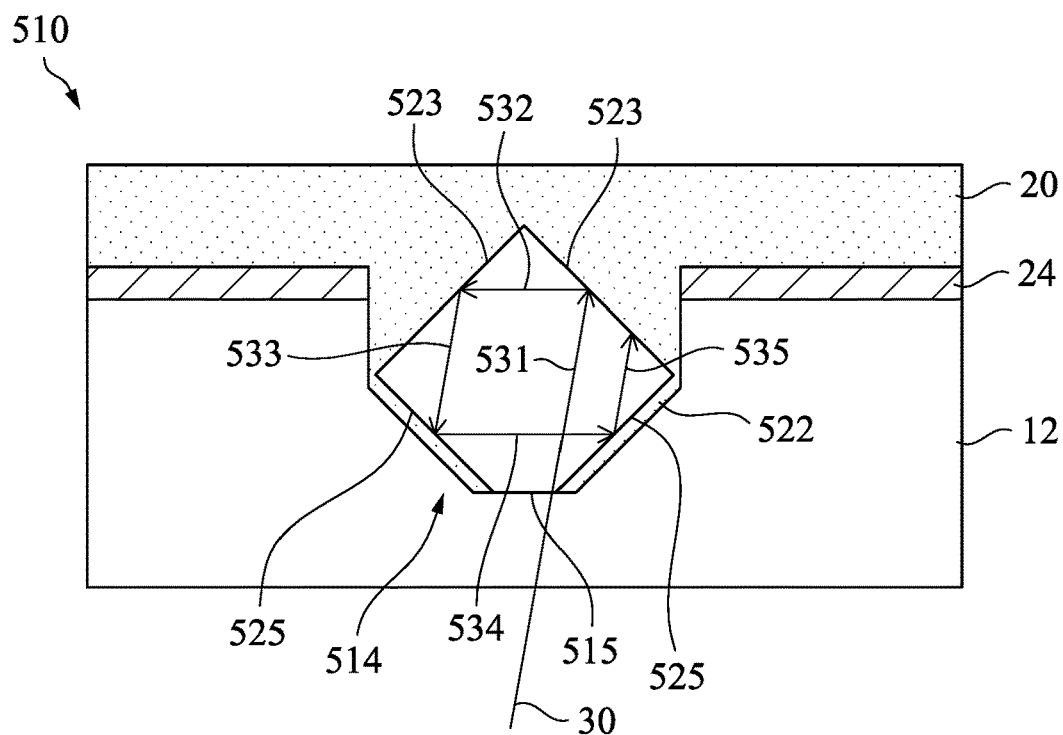
FIG. 8A is cross-sectional view illustrating a device.
Figure 8B:
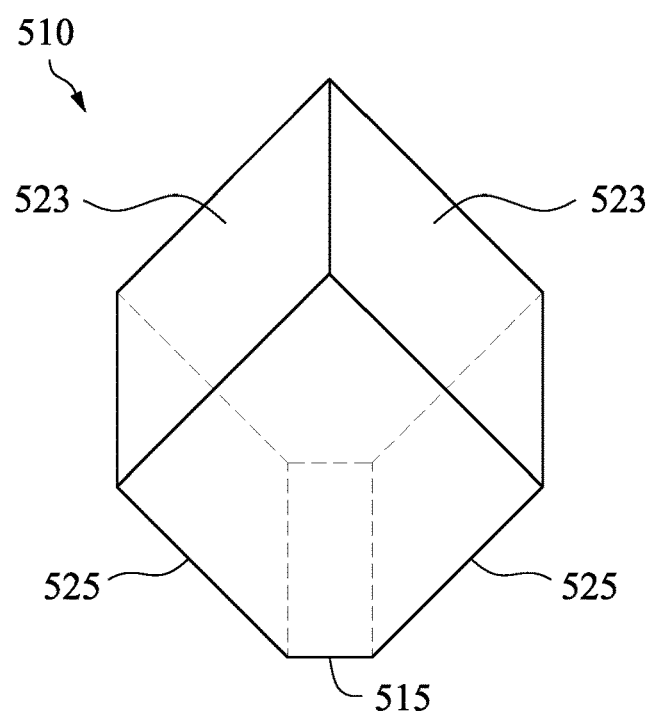
FIG. 8B is a perspective view illustrating the semiconductor layer of the device of FIG. 8A, in accordance with some embodiments.

FIG. 8A is cross-sectional view illustrating a device 510 and FIG. 8B is a perspective view illustrating the semiconductor layer of the device 510, in accordance with one or more embodiments of the present disclosure. The device 510 shown in FIGS. 8A and 8B is substantially similar in many respects to the device 10 shown and described previously herein with respect to FIG. 1. The description of the device 510 will focus on the differences from the device 10 previously described herein. As shown in FIGS. 8A and 8B, the semiconductor layer 18 of the device 510 includes a lower surface 515 on the substrate 12 at a floor of the cavity 514. Lower angled surfaces 525 extend outwardly and upwardly from the lower surface 515 of the semiconductor layer 18, and upper angled surfaces 523 extend upwardly and inwardly from the lower angled surfaces 525.

The lower and upper angled surfaces 525, 523 of the device 510 may be substantially symmetrical to one another and may be formed to have any angle suitable to facilitate total internal reflection of radiation at the various interfaces between the lower and upper angled surfaces 525, 523 and the cover layer 20, portions of the cover layer 20 in the cavity 514, or sidewall spacers 522 in the cavity 514.

As shown in FIG. 8A, an optical a path length (or quantum effect length) of the incident radiation 30 within the semiconductor layer 18 includes a first segment 531, a second segment 532, a third segment 533, a fourth segment 534, and a fifth segment 535. The incident radiation 30 may be received at the lower surface 515 of the semiconductor layer 18 and travels along the first segment 531 of the quantum effect length until it encounters a first upper angled surface 523 at the upper side of the semiconductor layer 18 (e.g., as shown at the upper right-hand side in FIG. 8A), where the radiation 30 is totally internally reflected at the interface between the first upper angled surface 523 and the cover layer 20. The totally internally reflected radiation then travels along the second segment 532 of the quantum effect length until it encounters a second upper angled surface 523 (e.g., as shown at the upper left-hand side in FIG. 8A), where it may be totally internally reflected at the interface of the second upper angled surface 523 and the cover layer 20. The radiation 30 then travels along the third segment 533 of the quantum effect length until it encounters a first lower angled surface 525 (e.g., as shown at the lower left-hand side in FIG. 8A), where it may be totally internally reflected at the interface of the first lower angled surface 525 and the cover layer 20 or sidewall spacer 522. The radiation 30 may then travel along the fourth segment 534 of the quantum effect length until it encounters a second lower angled surface 525 (e.g., as shown at the lower right-hand side in FIG. 8A), where it may be totally internally reflected and travels along the fifth segment 535 toward the first angled surface 523 of the semiconductor layer 18, where it may again be totally internally reflected. The radiation 30 may continue to be totally internally reflected at the various interfaces of the semiconductor layer 18 and the cover layer 20 or sidewall spacers 522.

It will be readily appreciated that the device 510 shown in FIGS. 8A and 8B may be formed by the method illustrated in FIGS. 3A through 3E with one or more modifications. For example, the cavity 514 may be formed by a substantially same process as described and illustrated with respect to FIG. 3B; however, the cavity 514 may be formed to have angled surfaces that correspond to the lower angled surfaces 525 of the semiconductor layer 18. The sidewall spacers 522 may be formed by thermal oxidation, as described with respect to FIG. 3C. The semiconductor layer 18 may be epitaxially grown from the exposed lower surface 515 of the substrate 12, as described with respect to FIG. 3D. In some embodiments, the semiconductor layer 18 may be epitaxially grown in the cavity 514, and post-growth processing (e.g., photolithography, etching, film deposition, etc.) may be performed to achieve a desired shape of the semiconductor layer 18.

Figure 9A:
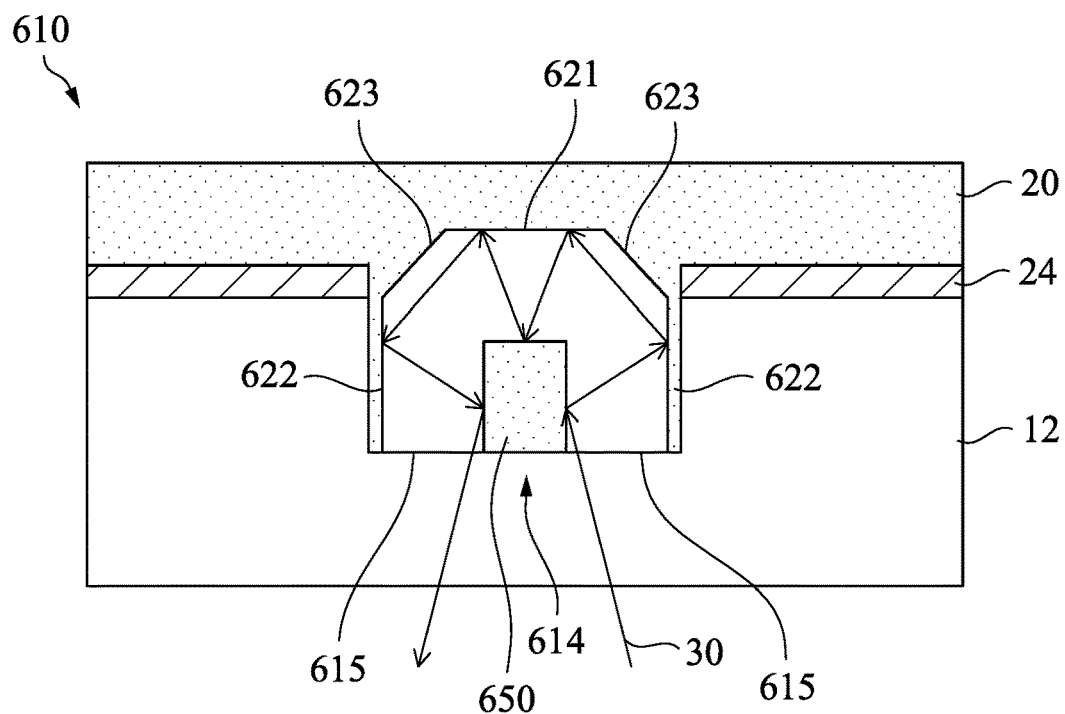
FIG. 9A is cross-sectional view illustrating a device.
Figure 9B:
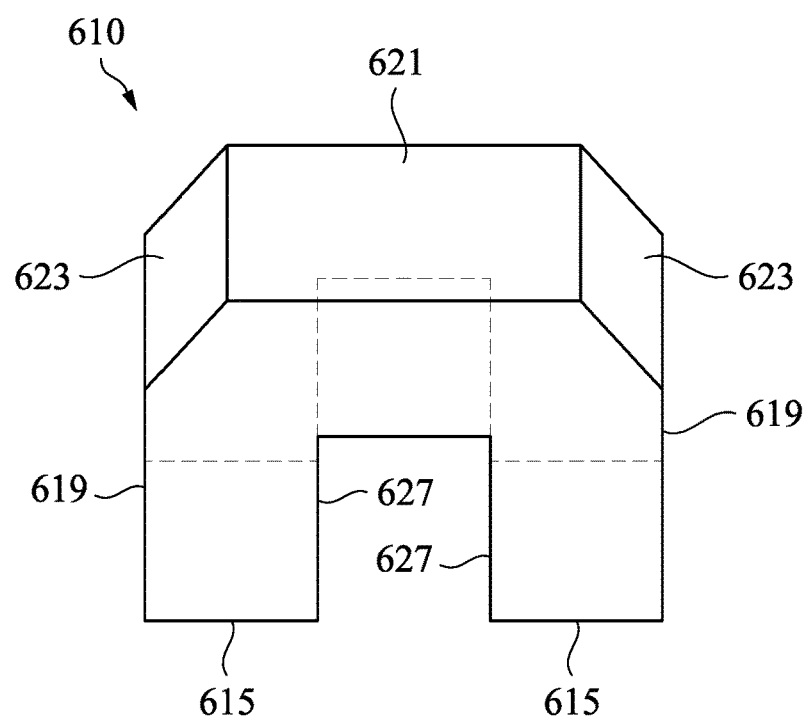
FIG. 9B is a perspective view illustrating the semiconductor layer of the device of FIG. 9A, in accordance with some embodiments.

FIG. 9A is cross-sectional view illustrating a device 610 and FIG. 9B is a perspective view illustrating the semiconductor layer of the device 610, in accordance with one or more embodiments of the present disclosure. The device 610 shown in FIGS. 9A and 9B is substantially similar in many respects to the device 10 shown and described previously herein with respect to FIG. 1. The description of the device 610 will focus on the differences from the device 10 previously described herein. As shown in FIGS. 9A and 9B, the semiconductor layer 18 of the device 610 may have a substantially inverted U-shape with lower surfaces 615 on the substrate 12 at the floor of the cavity 614. Portions of the semiconductor layer 18 are separated or spaced apart from one another at a lower region of the semiconductor layer 18 by a segment of a dielectric material 650, which in some embodiments may be formed of the same material as the cover layer 20 or sidewall spacers 622.

The semiconductor layer 18 has outer side surfaces 619 that abut or contact the sidewall spacers 622, and inner side surfaces 627 that abut or contact the segment of dielectric material 650. The semiconductor layer 18 of the device 610 further includes angled surfaces 623 at the upper side of the semiconductor layer 18 that extend between the outer side surfaces 619 and the upper surface 621.

The angled surfaces 623 and upper surface 621 may be substantially the same or identical to the angled surfaces 23 and upper surface 21, respectively, of the device 10 shown and described previously herein.

As shown in FIG. 9A, an optical a path length (or quantum effect length) of the incident radiation 30 within the semiconductor layer 18 may include a variety of segments and the incident radiation 30 may be totally internally reflected at a variety of interfaces between the semiconductor layer 18 and one or more of the cover layer 20, the sidewall spacers 622, or the segment of dielectric material 650.

It will be readily appreciated that the device 610 shown in FIGS. 9A and 9B may be formed by the method illustrated in FIGS. 3A through 3E with one or more modifications. For example, the cavity 614 may be formed by a substantially same process as described and illustrated with respect to FIG. 3B. The sidewall spacers 622 may be formed by thermal oxidation, as described with respect to FIG. 3C, the segment of dielectric material 650 may be formed by any suitable technique, including, for example, by thermal oxidation or the like. In some embodiments, the segment of dielectric material 650 may be formed by forming a dielectric layer (e.g., by deposition, oxidation, or any suitable technique) in the cavity 614 (which may be performed in a same process as the formation of the sidewall spacers 622), and portions of the dielectric layer may be selectively removed (e.g., by etching) to form the segment of dielectric material 650. The semiconductor layer 18 may be epitaxially grown from the exposed lower surfaces 615 of the substrate 12, as described with respect to FIG. 3D.

Figure 10A:
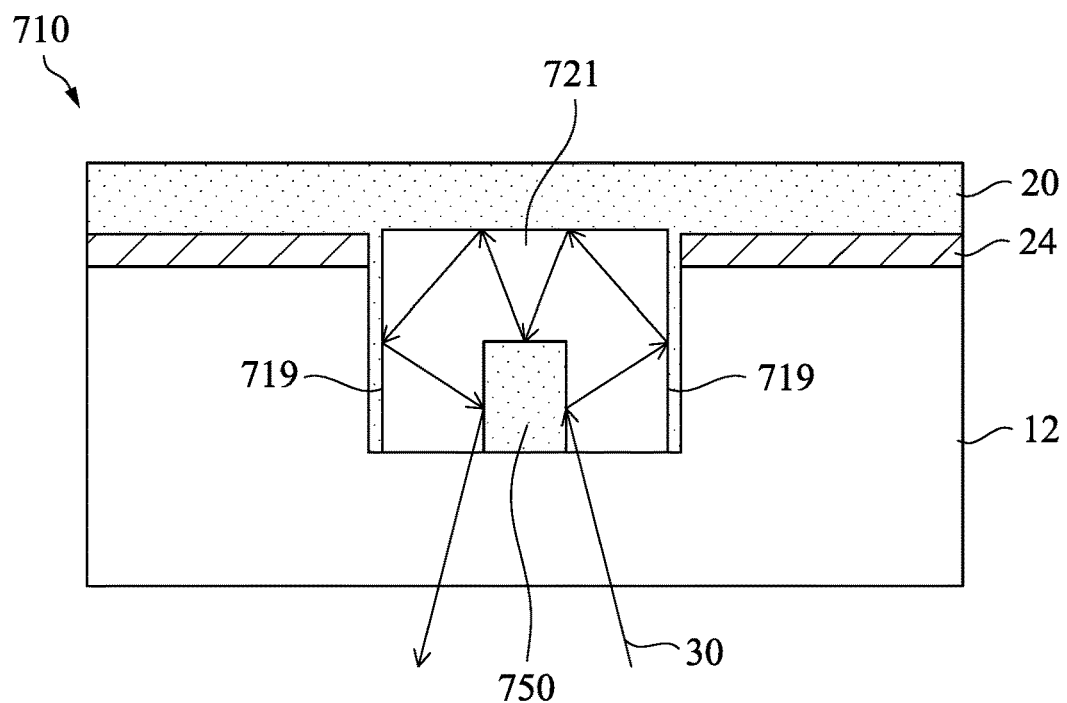
FIG. 10A is cross-sectional view illustrating a device.
Figure 10B:
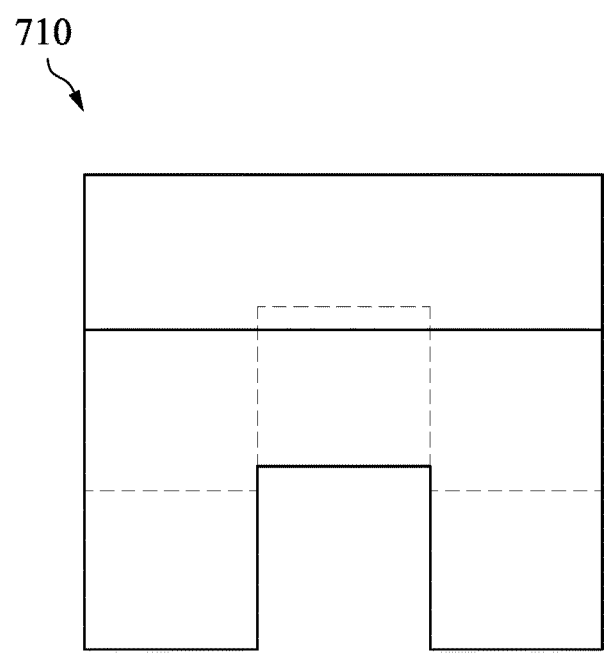
FIG. 10B is a perspective view illustrating the semiconductor layer of the device of FIG. 10A, in accordance with some embodiments.

FIG. 10A is cross-sectional view illustrating a device 710 and FIG. 10B is a perspective view illustrating the semiconductor layer of the device 710, in accordance with one or more embodiments of the present disclosure. The device 710 shown in FIGS. 10A and 10B is substantially the same as the device 610 shown and described with respect to FIGS. 9A and 9B, except for the differences noted below. In particular, the difference between the device 710 of FIGS. 10A and 10B and the device 610 of FIGS. 9A and 9B is that the device 710 does not include the angled surfaces 623. Instead, the semiconductor layer 18 of the device 710 has an upper surface 721 that extends between the outer side surfaces 719.

As shown in FIG. 10A, an optical a path length (or quantum effect length) of the incident radiation 30 within the semiconductor layer 18 may include a variety of segments and the incident radiation 30 may be totally internally reflected at a variety of interfaces between the semiconductor layer 18 and one or more of the cover layer 20, the sidewall spacers 722, or the segment of dielectric material 750.

The device 710 may be formed in a substantially similar manner as described with respect to forming the device 610; however, angled surfaces are not formed at the upper portion of the device 710. Instead, the upper surface 721 of the device 710 may be formed, for example, by epitaxial growth of the semiconductor layer or post-growth processing (e.g., photolithography, etching, CMP, etc.) may be performed to achieve a desired shape of the semiconductor layer 18. For example, in some embodiments, the device 710 may be formed by planarizing (e.g., by CMP) an upper surface of the semiconductor layer 18 of the device 610 to remove the angled surfaces.

The present disclosure provides, in various embodiments, photonic devices, structures, and methods in which a semiconductor layer that receives incident irradiation and converts the received irradiation into an electrical signal has a high quantum efficiency. The quantum efficiency may be achieved by increasing the quantum effect length of the received irradiation through the semiconductor material, which in some embodiments is facilitated by total internal reflection of the irradiation within the semiconductor material. By increasing the quantum effect length of the received irradiation through total internal reflection, the height, as well as other dimensions of the semiconductor layer, may be significantly reduced as compared to structures in which radiation is not totally internally reflected.

According to one embodiment, a photonic device includes a substrate having a first surface. A cavity extends into the substrate from the first surface to a second surface. A semiconductor layer is disposed on the second surface in the cavity of the substrate, and a cover layer is disposed on the semiconductor layer. The semiconductor layer is configured to receive incident radiation through the substrate and to totally internally reflect the radiation at an interface between the semiconductor layer and the cover layer.

According to another embodiment, a method is provided that includes forming a cavity in a substrate. The cavity is formed to extend into the substrate from a first surface to a second surface. Sidewall spacers are formed on sidewalls of the substrate in the cavity. A semiconductor layer is formed on the second surface in the cavity of the substrate, and the semiconductor layer abuts the sidewall spacers in the cavity.

According to yet another embodiment, an imaging device includes a first substrate having a first surface. A plurality of cavities extend into the first substrate from the first surface. An array of photodetectors is formed in the plurality of cavities of the first surface. Each of the photodetectors includes a semiconductor layer on the second surface in the cavity of the substrate, and a cover layer on the semiconductor layer. The semiconductor layer is configured to receive incident radiation through the first substrate and to totally internally reflect the radiation at an interface between the semiconductor layer and the cover layer. The imaging device further includes electrical circuitry electrically coupled to the array of photodetectors and configured to receive and process electrical signals generated by the array of photodetectors in response to receiving the incident radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
forming a cavity in a substrate, the cavity extending into the substrate from a first surface to a second surface;
forming sidewall spacers on sidewalls of the substrate in the cavity;
forming a semiconductor layer on the second surface in the cavity of the substrate, the semiconductor layer abutting the sidewall spacers in the cavity; and
forming a cover layer on the semiconductor layer, the first surface of the substrate, and the sidewall spacers.

2. The method of claim 1, wherein the substrate comprises silicon, the sidewall spacers comprise silicon oxide, silicon nitride, or silicon oxynitride, and the semiconductor layer comprises germanium or a Group III-V semiconductor material.

3. The method of claim 1, wherein the forming the cover layer includes forming the cover layer of a same material as the sidewall spacers.

4. The method of claim 1, wherein the forming the cover layer includes forming the cover layer of a material having a refractive index that is less than a refractive index of the semiconductor layer.

5. The method of claim 1, further comprising forming a dielectric layer on the first surface of the substrate, wherein the forming the cavity includes etching through the dielectric layer and into the substrate, and wherein the forming the cover layer includes forming the cover layer on the dielectric layer.

6. The method of claim 5, wherein the substrate comprises monocrystalline silicon, and wherein the sidewall spacers and the dielectric layer are formed by performing a thermal oxidation on the monocrystalline silicon to establish a continuous layer of silicon oxide corresponding to the sidewall spacers the dielectric layer.

7. The method of claim 6, wherein the semiconductor layer comprises germanium or a Group III-V semiconductor material that directly contacts the continuous layer of silicon oxide.

8. The method of claim 1, wherein the forming the semiconductor layer includes forming the semiconductor layer to have at least one angled surface, the at least one angled surface extending between a side surface and an upper surface of the semiconductor layer.

9. The method of claim 1, further comprising:
prior to forming the cavity in the substrate, forming a dielectric layer on the first surface of the substrate, wherein the dielectric layer comprises silicon oxide, silicon nitride, or silicon oxynitride.

10. A method, comprising:
receiving a CMOS image sensor substrate including a first side and a second side, the CMOS image sensor substrate comprising silicon;
forming a cavity in the second side of the CMOS image sensor substrate, the cavity extending toward the first side of the CMOS image sensor substrate and the cavity having outer extents defined by inner sidewalls of the CMOS image sensor substrate;
forming a sidewall dielectric spacer structure in the cavity on the inner sidewalls of the CMOS image sensor substrate;
forming a photodetector structure comprising germanium or a Group III-V semiconductor material in the cavity, the photodetector structure directly contacting the sidewall dielectric spacer structure; and
forming an interconnect structure disposed on the second side of the CMOS image sensor substrate, the interconnect structure comprises a dielectric structure and a plurality of vias and wires arranged within the dielectric structure.

11. The method of claim 10, further comprising: prior to forming the interconnect structure, forming a cover layer on the photodetector structure, on the second side of the CMOS image sensor substrate, and on the sidewall dielectric spacer structure.

12. The method of claim 11, wherein the cover layer separates the photodetector structure from the interconnect structure.

13. The method of claim 11, further comprising:
bonding a second substrate comprising electrical circuitry to the interconnect structure, wherein after the bonding, the interconnect structure separates the CMOS image sensor substrate from the second substrate and the electrical circuitry is electrically coupled to the photodetector structure through the interconnect structure.

14. The method of claim 10, further comprising:
forming a plurality of optical lenses on the first side of the CMOS image sensor substrate, wherein an optical lens is configured to focus incident radiation through the CMOS image sensor substrate to the photodetector structure.

15. The method of claim 10, further comprising:
prior to forming the cavity in the CMOS image sensor substrate, forming a dielectric layer on the second side of the CMOS image sensor substrate, wherein the dielectric layer comprises silicon oxide, silicon nitride, or silicon oxynitride.

16. A method of forming a photonic device, comprising:
receiving a substrate having a first surface and a second surface, where a semiconductor material of the substrate comprises crystalline silicon or gallium arsenide;
forming a cavity extending into the substrate from the first surface toward the second surface and terminating at a recessed surface in the substrate;
forming a semiconductor layer on the recessed surface and extending toward the first surface, the semiconductor layer including a semiconductor material that differs from the semiconductor material of the substrate; and
forming a cover layer on the semiconductor layer,
wherein the semiconductor layer is configured to receive incident radiation through the substrate and to totally internally reflect the incident radiation at an interface between the semiconductor layer and the cover layer.

17. The method of claim 16, wherein the semiconductor layer has a first refractive index, and the cover layer has a second refractive index that is less than the first refractive index.

18. The method of claim 17, wherein the first refractive index is within a first range from 2 to 6, and the second refractive index is within a second range from 0 to 2.

19. The method of claim 16, wherein the semiconductor layer includes at least one of germanium (Ge), silicon germanium (SiGe), or a Group III-V semiconductor material, and wherein the cover layer includes at least one of silicon oxide ($SiO_x$), silicon oxynitride (SiON), or silicon nitride (SiN).

20. The method of claim 16, wherein the cavity has a depth ranging up to 700 micrometers and a width ranging up to 700 micrometers.

* * * * *